United States Patent
Boezen et al.

(10) Patent No.: US 8,004,318 B2
(45) Date of Patent: Aug. 23, 2011

(54) CIRCUIT ARRANGEMENT FOR CONTROLLING A HIGH SIDE CMOS TRANSISTOR IN A HIGH VOLTAGE DEEP SUB MICRON PROCESS

(75) Inventors: Henk Boezen, Nijmegen (NL); Clemens De Haas, Ewijk (NL); Gerrit Bollen, Dieren (NL); Inesz Weijland, Malden (NL)

(73) Assignee: NXP B.V., Eindhoven (NL)

( * ) Notice: Subject to any disclaimer, the term of this patent is extended or adjusted under 35 U.S.C. 154(b) by 22 days.

(21) Appl. No.: 12/515,611

(22) PCT Filed: Nov. 15, 2007

(86) PCT No.: PCT/IB2007/054666
§ 371 (c)(1),
(2), (4) Date: May 20, 2009

(87) PCT Pub. No.: WO2008/062352
PCT Pub. Date: May 29, 2008

(65) Prior Publication Data
US 2010/0052774 A1    Mar. 4, 2010

(30) Foreign Application Priority Data
Nov. 21, 2006   (EP) .................................. 06124476

(51) Int. Cl.
*H03K 3/00* (2006.01)
(52) U.S. Cl. .......................... 327/108; 327/109; 327/390
(58) Field of Classification Search .................. 327/108, 327/109, 390
See application file for complete search history.

(56) References Cited

U.S. PATENT DOCUMENTS

| | | | | |
|---|---|---|---|---|
| 4,266,149 A | * | 5/1981 | Yoshida | 326/89 |
| 4,965,696 A | * | 10/1990 | Kumpfmueller et al. | 361/160 |
| 5,120,992 A | * | 6/1992 | Miller et al. | 327/111 |
| 5,317,206 A | * | 5/1994 | Hanibuchi et al. | 326/21 |

(Continued)

FOREIGN PATENT DOCUMENTS

| | | |
|---|---|---|
| EP | 1469603 A2 | 10/2004 |
| JP | 57-017162 A | 1/1982 |
| WO | 99/59249 A | 11/1999 |

OTHER PUBLICATIONS

Ong, A.K., et al; "A Method for Reducing the Variation in on Resistance of a MOS Sampling Switch"; Circuits and Systems, 2000; 2000 IEEE International Symposium on May 28-31, 2000, Piscataway, NY, USA; IEEE vol. 5; pp. 437-440; XP010504227; ISBN: 0-7803-5482-6.

*Primary Examiner* — Kenneth B. Wells

(57) ABSTRACT

The present invention relates to a circuit arrangement, which is used for controlling a high side CMOS transistor (M1) in a high voltage deep sub micron process. To provide a circuit arrangement for switching a high side CMOS transistor (M1) in a circuit having a very thin gate oxide, produced by a deep sub micron process, a circuit arrangement is proposed for controlling a high side CMOS transistor (M1), wherein the high side CMOS transistor (M1) is coupled between a high side voltage potential (Vbat) and a control output (OUT) for switching an external device, the high side CMOS transistor (M1) is controlled at its gate by a reference potential (Vbat-Vref), which is provided by a high side voltage reference (11) having a capacitor (C1), which is charged for switching on and discharged for switching off the high side CMOS transistor (M1).

8 Claims, 3 Drawing Sheets

U.S. PATENT DOCUMENTS

| | | |
|---|---|---|
| 5,587,895 A | 12/1996 | Harkins |
| 5,633,600 A * | 5/1997 | Ohnishi .......................... 326/17 |
| 5,721,485 A * | 2/1998 | Hsu et al. ....................... 713/323 |
| 6,433,592 B1 * | 8/2002 | Ehben ............................ 327/108 |
| 6,465,996 B2 * | 10/2002 | Nagata et al. ................. 323/303 |
| 7,098,633 B1 * | 8/2006 | Brokaw et al. ................. 323/222 |
| 7,388,422 B2 * | 6/2008 | Khan et al. ..................... 327/536 |
| 2002/0175719 A1 | 11/2002 | Cohen |
| 2005/0184759 A1 | 8/2005 | Tsukada |

\* cited by examiner

CIRCUIT ARRANGEMENT FOR CONTROLLING A HIGH SIDE CMOS TRANSISTOR IN A HIGH VOLTAGE DEEP SUB MICRON PROCESS

FIELD

The present invention relates to a circuit arrangement, which is used for controlling a high side Complementary Metal Oxide Semiconductor (CMOS) transistor in a high voltage deep sub micron process. The high side CMOS transistor is used for switching high voltages. But, in a high voltage deep sub micron process, the maximum allowed voltage across the gate oxide and the source of the high side transistor is limited to be smaller than a predetermined voltage rating, e.g. 3.3 V, while the voltage with respect to the substrate of the circuit arrangement can vary from 5 V to 100V, which is the high side voltage. In an automotive environment, the battery voltage of a car is between 5 V and 60V. This voltage may appear when the battery is charged and the connection to the battery is suddenly interrupted, a so-called load dump.

In other words, the supply voltage of the high side CMOS transistor exceeds the maximum voltage rating of the gate oxide. For limiting the gate voltage and for reliably operating the high side CMOS transistor, an accurate voltage reference is required to provide a voltage within the voltage rating of the gate oxide. This high side voltage reference must be accurate and provide a low current. Such accuracy is needed due to the low tolerance of the maximum voltage rating of the gate oxide of the high side CMOS transistor. Additionally, the circuit should consume as little current as possible due to reliability concerns. In the automotive industry, circuits can be fed directly from the battery. Therefore, they are continuously under voltage during the total lifecycle of a car. Thus, it is strongly required to reduce the current as much as possible, especially for chips having a very thin gate oxide, as in the case of a deep sub micron process.

BACKGROUND

A known solution for providing a high side voltage reference is a floating DC voltage source. However, such a solution does not have limited current consumption. Such a floating DC voltage source is illustrated in FIG. 1 in an abstract from.

BRIEF SUMMARY

Therefore, the object of the present invention is to provide a circuit arrangement for switching a high side CMOS transistor in a circuit having a very thin gate oxide, which is in particular produced by a deep sub micron process. This object is obtained by the features of the independent claims.

The invention is based on the idea of providing a high side voltage reference having a low current consumption. By providing such a high side voltage reference, it is possible to control the high side CMOS transistor without providing a circuit having a high current consumption. In particular, it is proposed to control the high side CMOS transistor at its gate with a high side reference potential including a capacitor which is charged or discharged and thereby switches on or off the high side CMOS transistor.

Due to the use of the capacitor, it is possible to create an accurate biasing voltage at the reference voltage for switching on the high side CMOS transistor. The capacitor is charged using a current having only a small number of pulses. The high side voltage reference used for the inventive circuit may include a resistor connected to the high side voltage and the reference voltage. The capacitor is coupled in parallel to the resistor between the high side voltage and the reference voltage. A diode is coupled between the resistor and the capacitor at the reference voltage for preventing a discharge of the charged capacitor during the off-periods of the pulsed current source.

In a preferred embodiment, it is proposed that the current source includes a first and a second switch, which are controlled to charge/discharge the capacitor and thereby to switch on/off the high side CMOS transistor. The first switch is connected to the cathode of the diode and to the first resistor of the high side voltage reference. The second switch is used for discharging the capacitor. The first and second switches are controlled by using a first and a second pulse, which are generated by an external clock. The duty cycle for the first and second pulses is very low. Thus, the effective current running through the circuit is drastically reduced.

In the preferred embodiment, the first switch is realized as an N-type Metal Oxide Semiconductor (NMOS) transistor, which is switched on by the first pulse, which is applied to the gate of the first NMOS transistor. The NMOS transistor is creates a pulsed current flowing through the resistor, the diode, and the capacitor for charging the capacitor. By applying the first pulses to the first NMOS transistor, an accurate biasing voltage is created at the reference voltage, which is necessary for reliably switching on the high side CMOS transistor. Due to the use of the capacitor, it is possible to provide this accurate biasing voltage, which is within the voltage rating of the gate oxide. Thereby, the gate oxide of the high side CMOS transistor is prevented from being destroyed due to higher voltages.

The second switch is also realized as an NMOS transistor, which is switched on by a second pulse at its gate, wherein, by switching on the second pulse at the second NMOS transistor, the high side CMOS transistor is switched off. In particular, it is proposed to reliably discharge the capacitor to provide a further resistor between the high voltage and the reference voltage and to provide a third transistor between the high voltage and the reference voltage. By switching off the first transistor and by providing the second pulse at the gate of the second transistor, a voltage pulse is created across the further resistor between the high voltage and the reference voltage. Thus, the third transistor between the high side voltage and the reference voltage is driven, thereby discharging the capacitor and resulting in a switching off of the high side CMOS transistor.

In a preferred embodiment of the invention, the first and second pulses used for controlling the first and second switches are identical in their duty cycle. Alternatively, it may be advantageous that the first and second pulses have different forms. In particular, it may be required to charge the capacitor after switching off the high side transistor faster. Thus, it is required to extend the first pulse in time to charge the capacitor for a longer time.

In a further preferred embodiment, it is proposed to use a level shifter as a high side voltage reference for providing the reference potential voltage.

BRIEF DESCRIPTION

Below, preferred embodiments of the invention are explained in more detail by use of the following figures in which.

DETAILED DESCRIPTION

Figure 1:
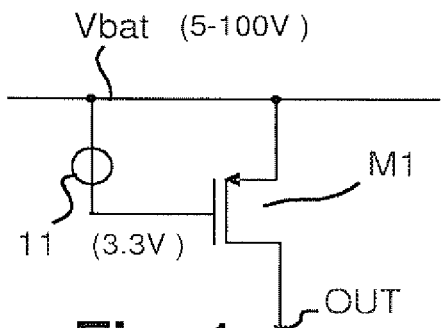
FIG. 1 shows a schematic circuit diagram of a floating DC voltage source for controlling the high side CMOS transistor.

FIG. 1 shows a schematic circuit diagram, in which a high side CMOS transistor M1 is coupled to the high side voltage Vbat and an external output OUT, wherein the gate of the high side CMOS transistor M1 is controlled by a high side voltage reference 11. The high side CMOS transistor M1 is used for switching high voltages. Since the gate source voltage of this high side CMOS transistor M1 has a limited voltage rating, an accurate high side voltage reference 11 is required to operate the high side CMOS transistor M1. This high side voltage reference 11 should consume as little power as possible, since it should be used in an automotive environment. Integrated circuits of a car may be coupled to the power supply (Vbat) during the whole lifetime of a car. Therefore, the power consumption should be reduced as much as possible.

Figure 2:
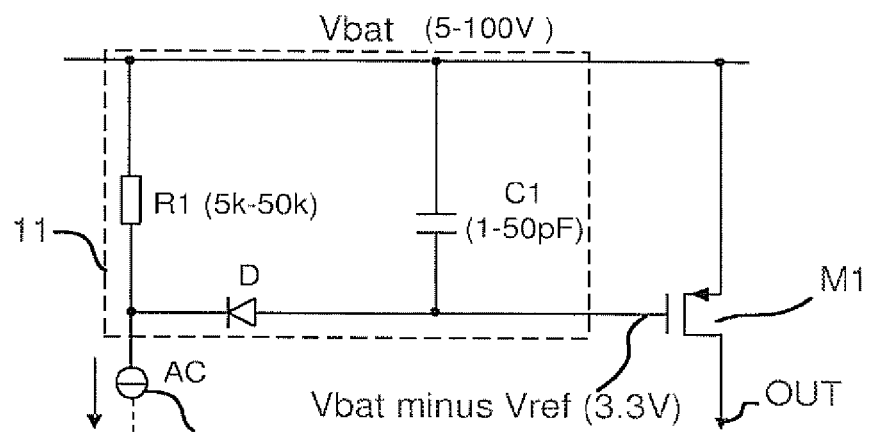
FIG. 2 shows a first embodiment.

In more detail, a circuit diagram is illustrated in FIG. 2. There is a high side CMOS transistor M1, which is coupled between the high side voltage Vbat, and an external output OUT. The high side voltage reference 11 is composed of a resistor R1 connected to the high side voltage Vbat and the reference voltage and a capacitor C1 having a capacity of 1 to 50 pF. The capacitor C1 is charged/discharged and thereby a switching on/off of the high side CMOS transistor M1 is achieved. The capacitor C1 is connected to the high side voltage Vbat and the reference voltage. For charging the capacitor C1, a pulsed current source 21 is used. For preventing a current flow during off cycles of the pulsed current source, which would cause a discharge of the capacitor C1, a diode D is connected between the capacitor C1 and the current source 21.

A first embodiment of a circuit arrangement is explained in more detail with reference to FIG. 3. Therein, the high side CMOS transistor M1 is connected between the high side voltage Vbat and the external output OUT. Further, there is a high side voltage reference 11 comprising the resistor R1, the capacitor C1, and the diode D between the resistor R1 and the capacitor C1. Additionally, there is the current source 21 comprising a first switch M3 and a second switch M4. The first switch M3 is realized as an NMOS transistor coupled between the reference voltage and ground via a further resistor R3. The first switch M3 is pulsed by a first pulse A. A second switch M4 is pulsed by a second pulse B, wherein a further resistor R4 is connected between the source of the second switch M4 and ground. A third transistor M2 is coupled between the high side voltage Vbat and the reference voltage, wherein the gate of the third transistor M2 is connected to second switch M4. A further resistor R2 is coupled between the high side voltage Vbat and the second switch M4 for providing a voltage for controlling the gate of the third transistor M2.

Figure 3:
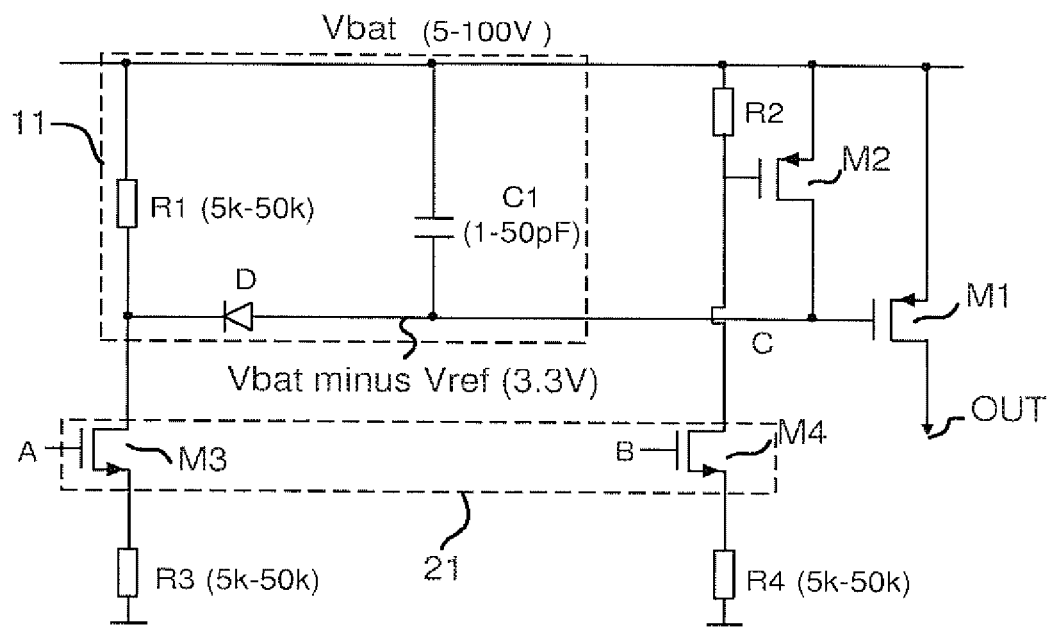
FIG. 3 shows a realization of the first embodiment.
Figure 4A:
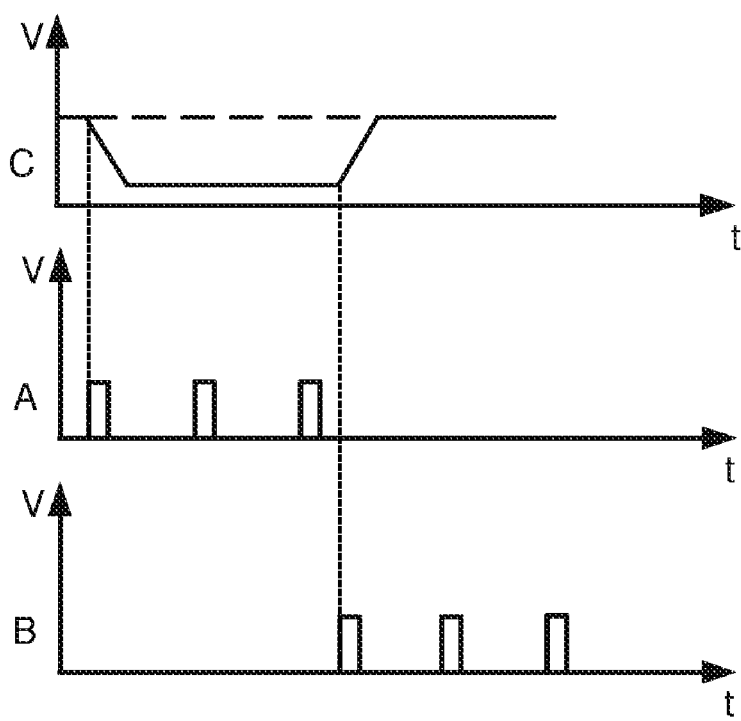
FIGS. 4a and 4b illustrate timing diagrams showing the first and second pulses for charging and discharging the capacitor.

Now, the functioning of the circuit diagram as shown in FIG. 3 is explained by use of FIG. 4a. When applying the first pulse A at the gate of the first switch M3, the peak voltage across the resistor R1 is determined by the peak voltage at the gate of the first switch M3 and the ratio of the resistors R1 and R3. By applying the pulse A at the gate of the first switch M3, the capacitor C1 is charged to an accurate voltage, which can drive the gate of the high side CMOS transistor M1. Thus, the high side CMOS transistor M1 could be switched on by use of an accurate voltage provided by the charge of the capacitor C1. For turning off the high side CMOS transistor M1, a first pulse A at the first switch M3 is switched off and a second pulse B is provided at the gate of the second switch M4 instead. This creates accurate voltage pulses across the resistor R2 between the high voltage Vbat and second switch M4 which drives the third transistor M2 to discharge the capacitor C1 and thereby switching off the high side CMOS transistor M1. Both switches M3, M4 are driven with a very low duty cycle as can be seen in FIG. 4a for charging the capacitor C1 or to keep the capacitor C1 discharged even in the presence of leakage currents. FIG. 4a illustrates the voltage waveforms on nodes A, B, C as shown in FIG. 4a. As long as there is a voltage drop across capacitor C1, it is charged. When switching off the first pulse A and switching on the second pulse B, instead, there is no voltage drop across C1 anymore. Thus, the capacitor C1 is discharged, resulting in a switching off the high side CMOS transistor M1.

Figure 4B:
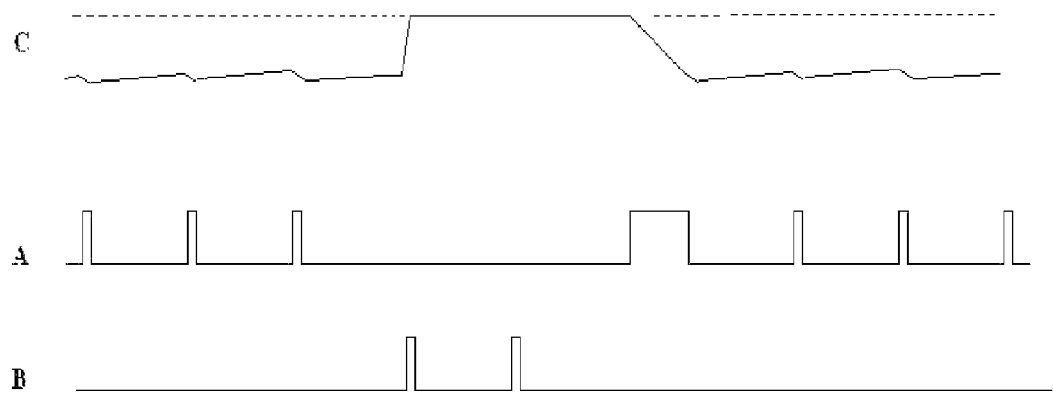

As shown in FIG. 4a, the pulses for the first and second switch M3 and M4 have identical duty cycles. However, it is possible to use different pulse forms as shown in FIG. 4b. Especially, when first switching on the first switch M3, after the second switch M4 was operated, the capacitor C1 is fully discharged and it is advantageous to switch on the first switch M3 for a longer time in order to charge capacitor C1 more quickly. This could be easily seen in FIG. 4b. The capacitor C1 is charged during one long pulse or several short pulses with a predetermined duty cycle as illustrated in FIG. 4b. After C1 is charged, a recharging with a low duty cycle with short pulses is necessary. Recharging is necessary because leakage currents are always present in silicon processes, which can discharge the capacitor C1 slowly. Therefore, a controlled discharge of the capacitor C1 would ideally be done with one pulse on the second switch M4, wherein the length of the pulse is unrelated to the length of the pulse on M3 which charges C1.

In case of identical pulses the pulse widths for pulses A and B maybe in the range of 0.1-1 µs, wherein the distance between the pulses maybe 0.1-1 ms. For FIG. 4b the same values could be used, wherein the longer pulse of pulse A may be three times longer than the shorter pulses of M4.

Figure 5:
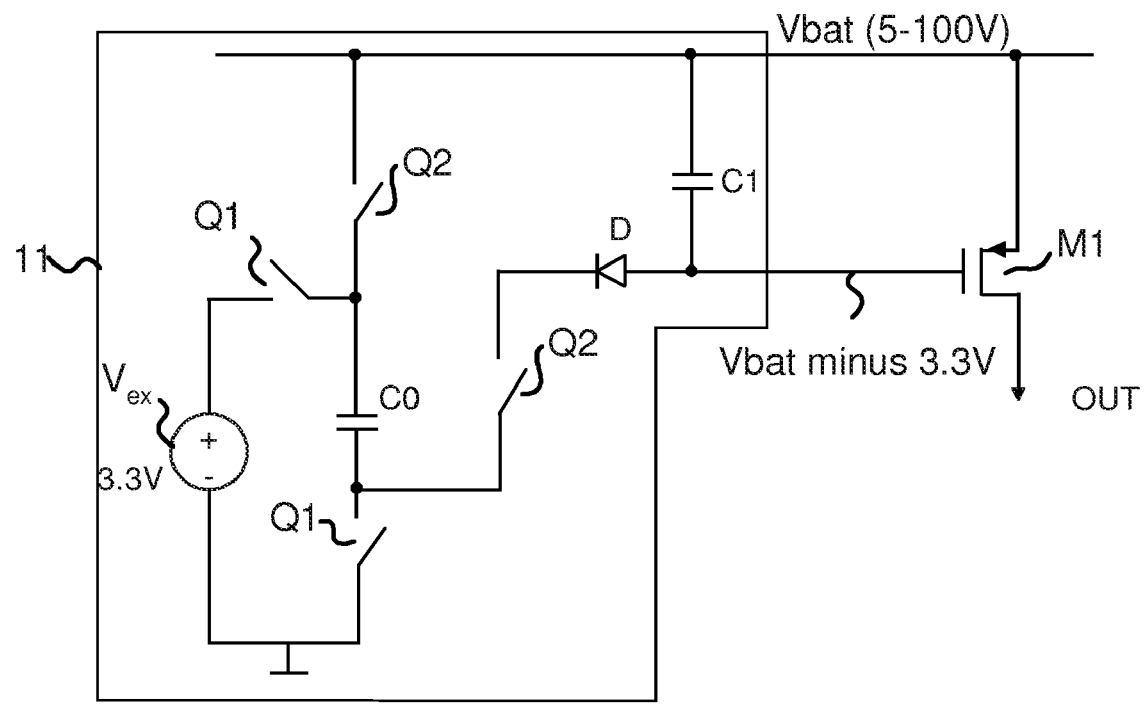
FIG. 5 shows second embodiment.

FIG. 5 illustrates a second embodiment of the circuit arrangement. FIG. 5 illustrates a high side voltage reference 11 providing the reference voltage for switching on/off the high side CMOS transistor M1. There is an external voltage source $V_{ex}$, providing a predetermined voltage, e.g., 3.3 V. By using a double-switch Q1, the external voltage source $V_{ex}$, can be connected to a second capacitor C0 for charging this second capacitor C0. The second capacitor C0 may be connected to the high voltage Vbat and to ground by switches Q1 or Q2, respectively. The switch Q2 connects the second capacitor C0 with the high side voltage Vbat. The second capacitor C0 is coupled in parallel to the first capacitor C1. At the reference potential, there is a diode D for preventing a discharge of the first capacitor C1. When switch Q1 is closed and switch Q2 is opened, the second capacitor C0 is charged at 3.3V. When switch Q2 is closed and switch Q1 is opened, the voltage drop on the second capacitor C0 is still 3.3V. The voltage drop on the first capacitor C1 is then increased to the high voltage Vbat-3.3V. Again, the diode D serves to make sure that current can flow back to C1 to discharge the first capacitor C1. By charging/discharging the first capacitor C1, the high side CMOS transistor M1 could be switched on/off. When switches Q1 and Q2 are controlled to discharge the first capacitor C1, the high side CMOS transistor M1 is switched off. By providing the low current high side voltage reference according to the second embodiment, it is possible to switch on/off the high side CMOS transistor M1 without destroying the very thin gate oxide of the high side CMOS transistor M1 that is produced in deep sub micron process.

A clear advantage of the second embodiment over the first is that there is no wasted power, when neglecting parasitic capacitances. When switched on, the first embodiment always consumes power even when the capacitor C1, that stores the high-side voltage, does not need to be charged. In contrast, the second embodiment only supplies the charge needed to create the required voltage.

The invention claimed is:

1. A circuit for protecting a Complementary Metal Oxide Semiconductor (CMOS) transistor from a high voltage supply, the circuit comprising:
 a first switching transistor coupled between the high voltage supply and the gate of the CMOS transistor;
 a reference circuit coupled between the gate of the CMOS transistor and the high voltage supply, wherein the reference circuit comprises:
  a diode coupled between the gate of the CMOS transistor and a reference voltage, and
  a first resistor coupled between the high voltage supply and the reference voltage,
  a capacitor coupled between the high voltage supply and the gate of the CMOS transistor; and
 a current source coupled between the reference circuit and a gate of the first switching transistor, wherein the current source switches the CMOS transistor on and off by charging and discharging the capacitor.

2. A circuit for protecting a Complementary Metal Oxide Semiconductor (CMOS) transistor from a high voltage supply, the circuit comprising:
 a first switching transistor coupled between the high voltage supply and the gate of the CMOS transistor;
 a reference circuit coupled between the gate of the CMOS transistor and the high voltage supply, wherein the reference circuit comprises a capacitor coupled between the high voltage supply and the gate of the CMOS transistor; and
 a current source coupled between the reference circuit and a gate of the first switching transistor, wherein the current source switches the CMOS transistor on and off by charging and discharging the capacitor and comprises a second switching transistor coupled between the reference voltage and a second resistor.

3. The circuit of claim 2, wherein the current source further comprises:
 a third switching transistor coupled to the gate of the first switching transistor.

4. The circuit of claim 2, wherein application of a sufficient number of pulses to the gate of the second switching transistor charges the capacitor.

5. The circuit of claim 2, wherein application of a sufficient number of pulses to the gate of the second switching transistor turns the CMOS transistor on.

6. The circuit of claim 3, wherein application of a sufficient number of pulses to the gate of the third switching transistor discharges the capacitor.

7. The circuit of claim 3, wherein application of a sufficient number of pulses to the gate of the third switching transistor turns the CMOS transistor off.

8. A circuit for protecting a Complementary Metal Oxide Semiconductor (CMOS) transistor from a high voltage supply, the circuit comprising:
 a first switching transistor coupled between the high voltage supply and the gate of the CMOS transistor;
 a reference circuit coupled between the gate of the CMOS transistor and the high voltage supply, wherein the reference circuit further comprises a capacitor coupled between the high voltage supply and the gate of the CMOS transistor; and
 a current source coupled between the reference circuit and a gate of the first switching transistor, wherein the current source switches the CMOS transistor on and off by charging and discharging the capacitor; and
 a resistor coupled between the high voltage supply and the gate of the first switching transistor.

* * * * *